(12) United States Patent
Kim

(10) Patent No.: US 8,154,679 B2
(45) Date of Patent: Apr. 10, 2012

(54) FLAT PANEL DISPLAY AND METHOD THEREOF

(75) Inventor: Young Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 398 days.

(21) Appl. No.: 12/425,487

(22) Filed: Apr. 17, 2009

(65) Prior Publication Data

US 2009/0262277 A1    Oct. 22, 2009

(30) Foreign Application Priority Data

Apr. 18, 2008  (KR) .................. 10-2008-0036373

(51) Int. Cl.
*G02F 1/1333* (2006.01)
(52) U.S. Cl. ........................................ 349/58
(58) Field of Classification Search .................. None
See application file for complete search history.

(56) References Cited

U.S. PATENT DOCUMENTS

| | | | | |
|---|---|---|---|---|
| 6,847,415 B1 * | 1/2005 | Yoshimura et al. | ............. | 349/58 |
| 7,916,237 B2 * | 3/2011 | Jung et al. | ............. | 349/58 |
| 2007/0139872 A1 * | 6/2007 | Lee et al. | ............. | 361/681 |
| 2007/0146570 A1 * | 6/2007 | Yu et al. | ............. | 349/58 |
| 2007/0171346 A1 * | 7/2007 | Chang et al. | ............. | 349/150 |
| 2008/0239192 A1 * | 10/2008 | Oohira | ............. | 349/58 |
| 2009/0073342 A1 * | 3/2009 | Jung et al. | ............. | 349/60 |

FOREIGN PATENT DOCUMENTS

| | | |
|---|---|---|
| JP | 2005062579 A | 3/2005 |
| KR | 1020070023338 A | 2/2007 |
| KR | 1020070064809 A | 6/2007 |

* cited by examiner

*Primary Examiner* — Sung Pak

(74) *Attorney, Agent, or Firm* — Cantor Colburn LLP

(57) ABSTRACT

A flat panel display includes a display panel, a mold frame receiving the display panel and a flexible printed circuit including a first portion disposed under the mold frame and a second portion extended from an end of the first portion and connected to the display panel. The first portion of the flexible printed circuit is attached to the mold frame. The mold frame includes a sidewall extending in a first direction, and a receiving plate extended from the sidewall in substantially a second direction perpendicular to the first direction. The receiving plate of the mold frame is disposed between the display panel and the flexible printed circuit.

20 Claims, 5 Drawing Sheets

FLAT PANEL DISPLAY AND METHOD THEREOF

This application claims priority to Korean Patent Application No. 2008-0036373 filed on Apr. 18, 2008, and all the benefits accruing therefrom under 35 U.S.C. §119, the contents of which are herein incorporated by reference in its entirety.

BACKGROUND OF THE INVENTION

1. Field of the Invention

The present invention relates to display devices and more particularly to a slim and lightweight flat panel display.

2. Description of the Related Art

Flat panel displays are widely used in products such as cell phones, monitors and televisions. The flat panel display includes a display panel, a mold frame and a receiving container to receive the display panel, and a driving unit to drive the display panel. The driving unit includes a printed circuit board and integrated circuit chips mounted on the printed circuit board. The driving unit is disposed below the receiving container receiving the mold frame and the display panel. The flat panel display is getting slimmer and lighter to provide better portability and possess less space.

BRIEF SUMMARY OF THE INVENTION

Since the receiving container of the flat panel display includes a base plate and a plurality of sidewalls, and may also be made of a metallic plate, there may be disadvantages in an overall thickness and weight of the flat panel display. For example, a thickness of the base plate may be thicker than 0.1 millimeter (mm), and the overall thickness and weight of the flat panel display undesirably increases.

Accordingly, the present invention is provided to substantially obviate one or more problems due to limitations and disadvantages of the related art.

An exemplary embodiment of flat panel display according to the present invention includes a display panel, a mold frame receiving the display panel and a flexible printed circuit including a first portion disposed under the mold frame and a second portion extended from one end of the first portion and connected to the display panel. The first portion of the flexible printed circuit is attached to the mold frame. The mold frame includes a sidewall extending in a first direction, and a receiving plate extended from the sidewall in substantially a second direction perpendicular to the first direction. The receiving plate of the mold frame is disposed between the display panel and the flexible printed circuit.

In an exemplary embodiment, a lower surface of the first portion of the flexible printed circuit includes a plurality of chips driving the display panel. An adhesive sheet may be disposed between the receiving plate and the display panel. The flat panel display may include a support frame including a plurality of first plates overlapping outer side surfaces of the mold frame. The support frame may further include a plurality of second plates extended substantially perpendicular from the first plates and overlapping an upper surface of the mold frame. The support frame may further include a plurality of second plates extended substantially perpendicular from the first plates, and at least one of the second plates may be inserted into the sidewall.

An exemplary embodiment of a flat panel display includes the mold frame and the support frame, and is advantageously slimmer (e.g., has a reduced thickness) and is more lightweight as not including a base plate of a receiving container.

The structure and objective of the present invention can be more readily understood by persons skilled in the art from the following description of the exemplary embodiments taken in conjunction with the accompanying drawings.

BRIEF DESCRIPTION OF THE DRAWINGS

The present invention will become more apparent by describing exemplary embodiments thereof in detail with reference to the accompanying drawing in which.

DETAILED DESCRIPTION OF THE INVENTION

Figure 1:
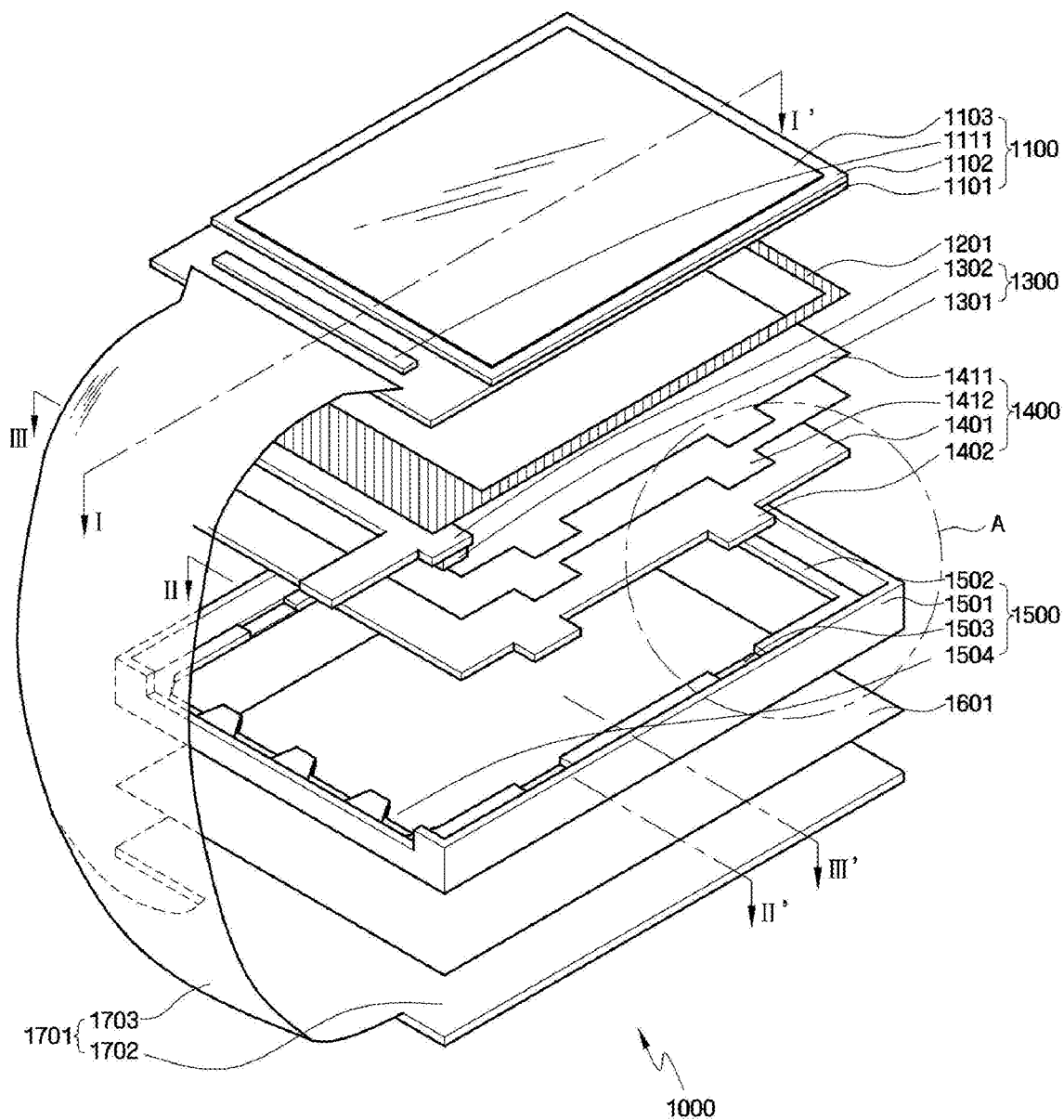
FIG. 1 is a perspective view showing an exemplary embodiment of a I-Liquid crystal display ("LCD") module according to the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or coupled to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below", "lower", "under," "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Figure 2A:
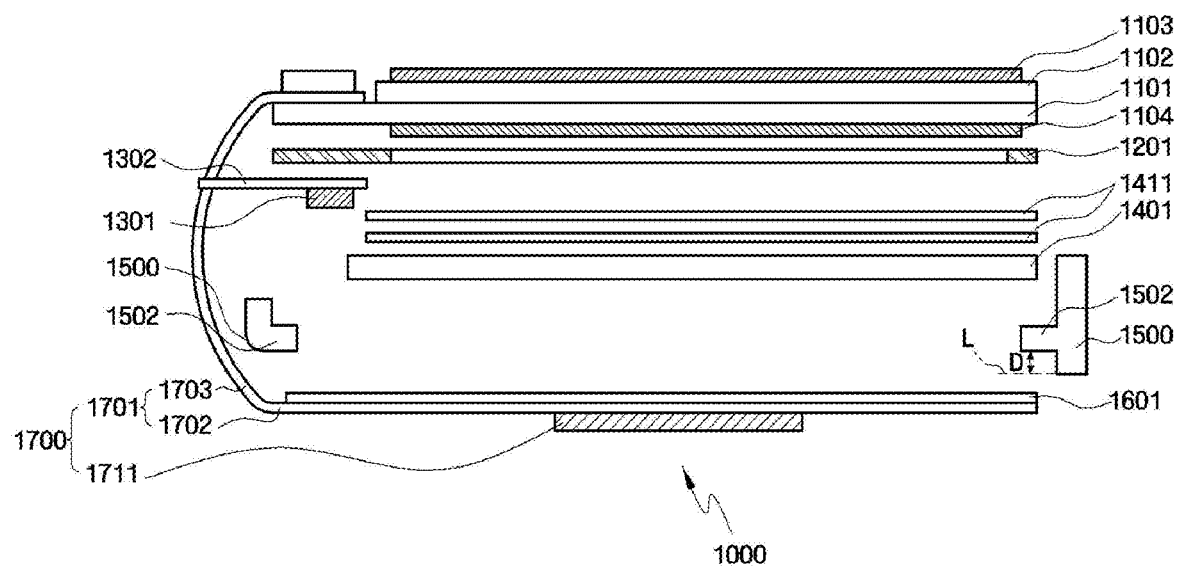
FIG. 2A is a cross-sectional view showing the LCD module taken along line I-I' of FIG. 1.
Figure 2B:
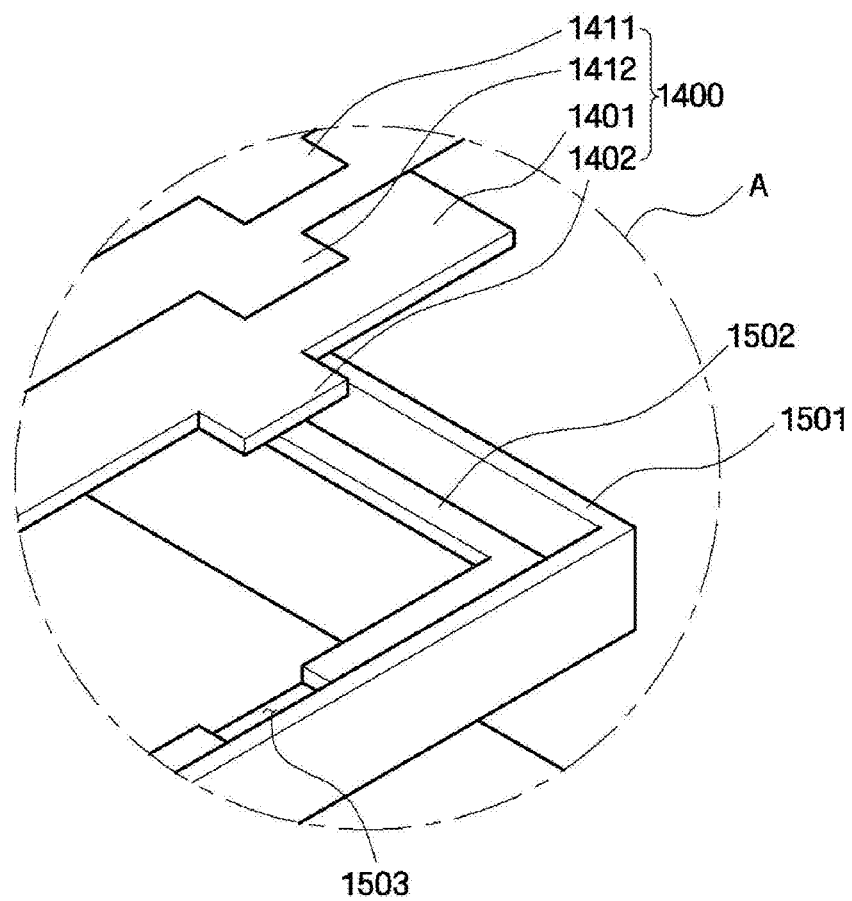
FIG. 2B is an enlarged view of portion A of the LCD module in FIG. 1.
Figure 3A:
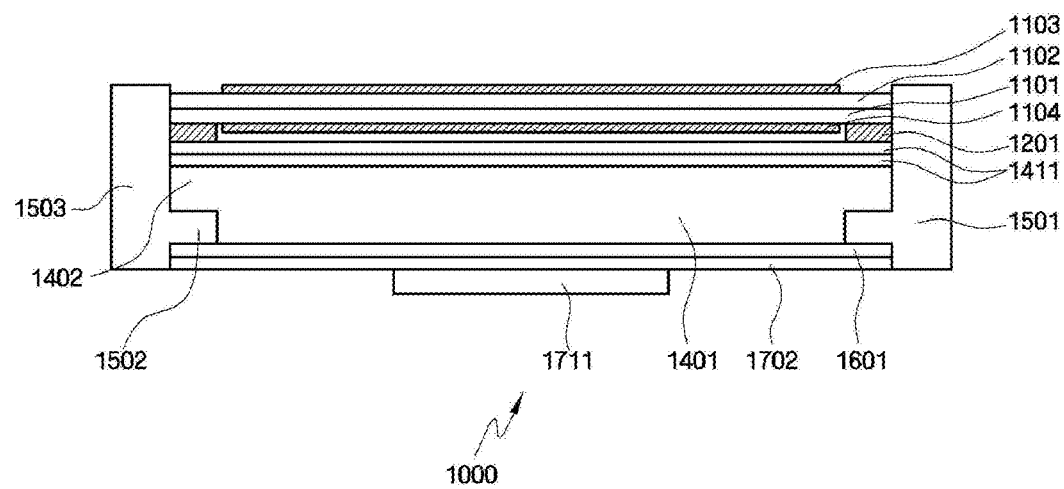
FIG. 3A is a cross-sectional view showing the LCD module taken along line II-II' of FIG. 1.
Figure 3B:
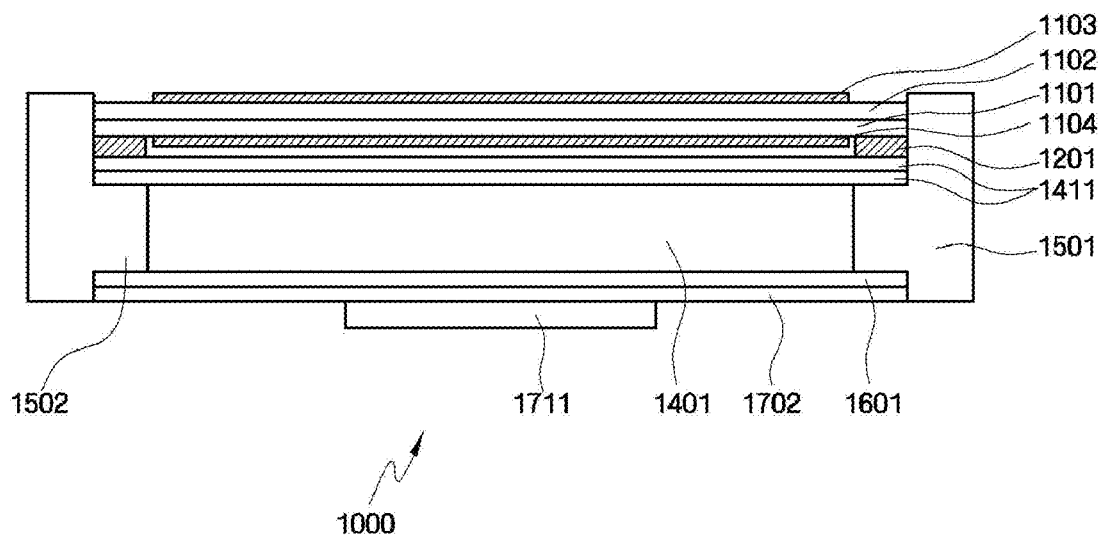
FIG. 3B is a cross-sectional view showing the LCD module taken along line III-III' of FIG. 1.

Hereinafter exemplary embodiments of the present invention will be described in detail with reference to the accompanying drawings. FIG. 1 is a perspective view showing an exemplary embodiment of an LCD module according to the present invention. Further, FIG. 2A is a cross-sectional view showing the LCD module taken along line I-I' of FIG. 1, FIG. 2B is an enlarged view of portion A of the LCD module in FIG. 1, FIG. 3A is a cross-sectional view showing the LCD module taken along line II-II' of FIG. 1, and FIG. 3B is a cross-sectional view showing the LCD module taken along line II-II' of FIG. 1.

Referring to FIGS. 1 through 3A, the LCD module 1000 includes an LCD panel 1100, a light generating unit 1300, a light guiding unit 1400, a mold frame 1500 and a driving unit 1700. The LCD module 1000 may include a reflective sheet 1601 and a panel sheet 1201.

The LCD panel 1100 includes a thin-film-transistor ("TFT") substrate 1101, a color filter substrate 1102, a first polarizer 1103, a second polarizer 1104, a liquid crystal layer (not shown) disposed between the TFT substrate 1101 and the color filter substrate 1102, and a driver integrated circuit ("IC") 1111 disposed on the TFT substrate 1101. The driver IC 1111 receives signals from the driving unit 1700 and drives the LCD panel 1100. In an exemplary embodiment, a plurality of the driver Ic 1111 may be disposed on the TFT substrate 1101, such as, gate driver ICs and/or data driver ICs. In alternative embodiments, it is possible to reduce a total number of driver ICs by using amorphous silicon gate ("ASG") technology. The driver IC 1111 receives signals from the driving unit 1700 through a flexible printed circuit ("FPC") 1702.

The light generating unit 1300 includes a printed circuit board ("PCB") 1302 and a plurality of a point light source 1301. In an exemplary embodiment, light emitting diodes ("LEDs") may be used as the point light sources 1301. A single point light source 1301 or the plurality of the point light sources 1301 may be disposed on the printed circuit board 1302. The printed circuit board 1302 may be a flexible printed circuit board 1302, and may be attached to the panel sheet 1201. Alternatively, the point light sources 1301 may be mounted on a FPC 1701 of the driving unit 1700. The light source of the light generating unit 1300 is not limited to a point light source. Other light sources, such as a lamp, may be used for the light generating unit 1300.

The light guiding unit 1400 includes a light guide plate 1401 and a plurality of an optical sheet 1411. The light guiding unit 1400 receives a light generated by the light generating unit 1300 and transfers the light to the LCD panel 1100. The optical sheets 1411 may include a diffuser sheet and a prism sheet. The light guide plate 1401 and/or the optical sheets 1411 may respectively include a first fixing protrusion 1402 and a second fixing protrusion 1412 which protrude from edges thereof and are fixed to the mold frame 1500.

The mold frame 1500 includes a plurality of a sidewall 1501 extended substantially vertically as shown in FIGS. 1-3B, a plurality of a receiving plate 1502 extended substantially horizontally from each of the sidewalls 1501 toward an inside area of the mold frame 1500, and first fixing groove 1503 and second fixing groove 1504 receiving and fixing the light generating unit 1300, the light guiding unit 1400 and the LCD panel 1100. In an exemplary embodiment, the panel sheet 1201 may include an adhesive member disposed between the receiving plate 1502 and the display panel 1100.

The first fixing grooves 1503 may be disposed on a longitudinal side of the LCD module 1000, while the second fixing grooves 1504 may be disposed on the transverse side of the LCD module 1000 substantially perpendicular to the longitudinal side. A thickness of the receiving plate 1502 including the first fixing grooves 1503 and/or the second fixing grooves 1504 may be thinner at a portion where the first fixing grooves 1503 and the second fixing grooves 1504 are respectively disposed. The first fixing grooves 1503 and/or the second fixing grooves 1504 may form a stepped portion in the receiving plate 1502 including the first fixing grooves 1503 and the second fixing grooves 1504, respectively.

Referring to FIG. 1, the sidewall 1501 at a side of the LCD module 1000 corresponding to where the FPC 1701 is disposed may include a cutout portion to accommodate the PCB 1302 and/or the FPC 1701 when they are bent along an exterior of the mold frame 1500 in an assembled LCD module 1000.

The second fixing grooves 1504 may be alternated with portions of the receiving plate 1502 which are not only thicker (e.g., in a vertical direction), but also wider in a direction taken from the sidewall 1501 including the cutout portion to an inside area of the mold frame 1500. These wider portions alternating with the second fixing grooves 1504 may be substantially trapezoidal shaped in a plan view. The point light sources 1301 may be disposed in the second fixing grooves 1504 while a lower surface of the PCB 1302 may be disposed directly on an upper surface of the wider portions of the receiving plate 1502 alternating with the second fixing grooves 1504.

Each of the plurality of the receiving plates 1502 may be extended from an inner surface of a respective sidewall 1501 in a direction substantially perpendicular to the respective sidewall 1501. The receiving plates 1502 may not overlap an entire of the reflective sheet 1601, such as to form an open area at the inside area of the mold frame 1500. The receiving plates 1502 may be extended from a sidewall 1501 at a distance away from an uppermost and lowermost surface of the sidewall 1501 in the vertical direction, as shown in the right hand mold frame 1500 in FIG. 2A, and forms a first receiving space below the receiving plate 1502 for the driving unit 1700. A lower surface of the receiving plate 1502 may be separated from a distal end "L" of the sidewall 1501 by a distance "D" shown in FIG. 2A. The receiving plate 1502 of the mold frame is disposed internal to the LCD module 1000 and is not exposed to an outside of the LCD module 1000.

A second receiving space may be formed above the receiving plate 1502, as defined by upper surfaces of the receiving plate 1502, and the inner surface of the sidewall 1501 to the uppermost surface of the receiving plate 1502. Alternatively, the receiving plates 1502 may be extended from a lower surface of the sidewall 1501, such as to form a bottom plate or surface of the mold frame 1500, as shown in the left hand mold frame 1500 in FIG. 2A.

The receiving plates 1502 receive the light guide plate 1401 and the light generating unit 1300 in the second receiving space. As shown in FIGS. 1 and 2B, the receiving plates 1502 may be connected to each other and form a single, continuous and indivisible member. The first fixing grooves 1503 receiving the first and second fixing protrusions 1402 and 1412 are disposed on a portion of an upper surface of the receiving plate 1502. The second fixing grooves 1504 receiving the light generating unit 1300 may be formed from an upper surface and completely through a lower surface of the receiving plate 1502. Alternatively, the second fixing grooves 1504 may be formed from the upper surface of and only partially through the receiving plate 1502, such that a total of the uppermost surface of the reflective plate 1502 collectively includes an upper surface at areas where the second fixing grooves 1504 are disposed and an upper surface at areas excluding the second fixing grooves 1504.

Referring again to FIGS. 1 and 2A, the driving unit 1700 includes a FPC 1701 and at least a chip 1711 mounted on the FPC 1701 and generating signals and voltages. The FPC 1701 may include a conductive layer transferring electric signals and voltages. The conductive layer may include a first portion 1702 and a second portion 1703. The first portion 1702 is disposed substantially horizontally and below the mold frame 1500, and the second portion 1703 is extended from a first end of first portion 1702 to a surface of the TFT substrate 1101 near the drive IC 1111. The first portion 1702 and the second portion 1703 of the FPC 1701 collectively form a single, continuous and indivisible member.

In exemplary embodiments, the second portion 1703 may be connected to the TFT substrate 1101 by film on glass ("FOG") technology. The second portion 1703 may be extended to a surface of the TFT substrate 1101 where the driver IC 1111 is mounted, such that one end of the FPC 1701 is disposed between the TFT substrate 1101 and the driver IC 1111, as shown in FIG. 2A. The one end of the FPC 1701 disposed on a peripheral area of the TFT substrate 1101 and between the TFT substrate 1101 and the driver IC 1111 may be referred to as a third portion of the FPC 1701 which is extended substantially horizontally and parallel with the first portion 1702. The third portion of the FPC 1701 contacts the driver IC 1111 and the peripheral area of the TFT substrate 1101 directly. The chip 1711 may be mounted directly on a lower surface of the first portion 1702.

Referring again to FIGS. 1 and 2A, the reflective sheet 1601 is disposed on the first portion 1702 of the FPC 1701. The reflective sheet 1601 may be attached to the upper surface of the first portion 1702 opposing the lower surface where the chip 1711 is mounted, such as by adhesive material. A whole of the reflective sheet 1601 may be overlapped with a portion of the first portion 1702. In an alternative embodiment, the reflective sheet 1601 may be substituted by a reflective layer disposed directly on the upper surface of the first portion 1702. The reflective layer may be formed by giving the upper surface of the first portion 1702 a coat of reflective material such as silver, aluminum or a various kind of an organic or inorganic material having relatively good reflectivity.

Referring to FIG. 3A, the first fixing protrusion 1402 of the light guide plate 1401 is disposed on the first fixing groove 1503 disposed on the receiving plate 1502 of the mold frame 1500. The FPC 1701 and the reflective sheet 1601 are disposed in the receiving space made by the receiving plates 1502 and the sidewalls 1501, so the side edges of the FPC 1701 and the reflective sheet 1601 are directly adjacent to, contact and face an inner surface of the side wall 1501 and are not exposed to outside of the mold frame 1500 or the LCD module 1000. An upper surface of the reflective sheet 1601 is also directly adjacent to, contacts and faces a lower surface of the receiving plate 1502. With this structure, the side wall 1501 advantageously reduces or effectively prevents particles from inflowing through a side surface of the LCD module 1000, and provides a relatively clean side surface by covering (e.g., overlapping) side edges of the FPC 1701 and the reflective sheet 1601.

Referring to FIG. 3B, the panel sheet 1201 is directly disposed on both the upper surface of the receiving plate 1502 and the lower surface of the LCD panel 1100, so the LCD panel 1100 is advantageously fixed to the mold frame 1500 in a more secure manner. As shown in FIGS. 1, 3A and 3B, the panel sheet 1201 includes a substantially frame shape and an opened area in a central portion corresponding to a display area of the LCD panel 1100, such as may be substantially defined by an area of the first polarizer 1403. A width of a peripheral region of the panel sheet 1201 at a transverse side of the LCD module 1000 proximate to where the third portion of the FPC 1701 is disposed, may be larger than a width of the remaining peripheral regions of the panel sheet 1201. The widths of the peripheral regions are taken substantially perpendicular to the respective edge of the panel sheet 1201.

An upper surface of the first polarizer 1103 and an upper surface of the sidewall 1501 of the mold frame 1500 are disposed substantially coplanar with each other, as illustrated in FIGS. 3A and 3B. A lower surface of the FPC 1701 and a lower surface of the sidewall 1501 of the mold frame 1500 are disposed substantially coplanar with each other as illustrated in FIGS. 3A and 3B. As the upper and lower surfaces of the mold frame 1500, the LCD panel 1100 and FPC 1701 are all disposed coplanar with each other, the overall thickness of the LCD module 1000 is advantageously minimized. Meanwhile, the FPC 1701 may cover the entire of the lower surface of the sidewall 1501. With this structure the thickness of the LCD module 1000 increases as the thickness of the FPC 1701. The LCD module 1000 of this embodiment is still thinner than a conventional LCD module, because thickness of a conventional FPC is a lot thinner than thickness of a conventional receiving container.

In the illustrated embodiment, since the driving unit 1700 is the lower most member in the assembled LCD module as shown in FIGS. 3A and 3B, and the receiving plates 1502 are not exposed to an outside of the LCD module 1000, there is no separate back plate of the mold frame 1500, or of any receiving container of the LCD module 1000. Advantageously, the overall thickness and weight of the LCD module 1000 is advantageously further minimized and reduced.

Additionally, boundaries of the mold frame 1500 may be defined by all of the outer faces, sides and edges of the mold frame 1500. Since the LCD panel 1100, the light generating unit 1401, the reflective sheet 1601, the FPC 1701 and the second support frame 1900 are completed received within the boundaries of the mold frame 1500 (e.g., in a vertical direction), the overall thickness and weight of the LCD module 1000 is advantageously further minimized and reduced.

Figure 4:
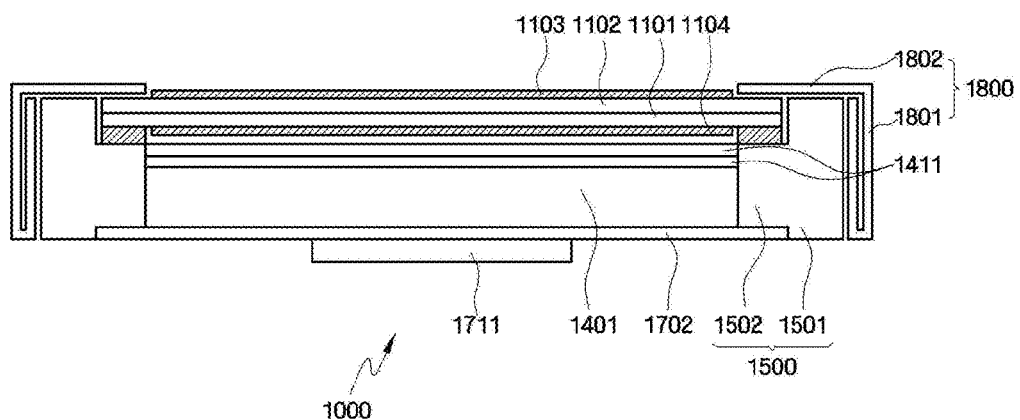
FIG. 4 is a cross-sectional view showing another exemplary embodiment of an LCD module according to the present invention.
Figure 5:
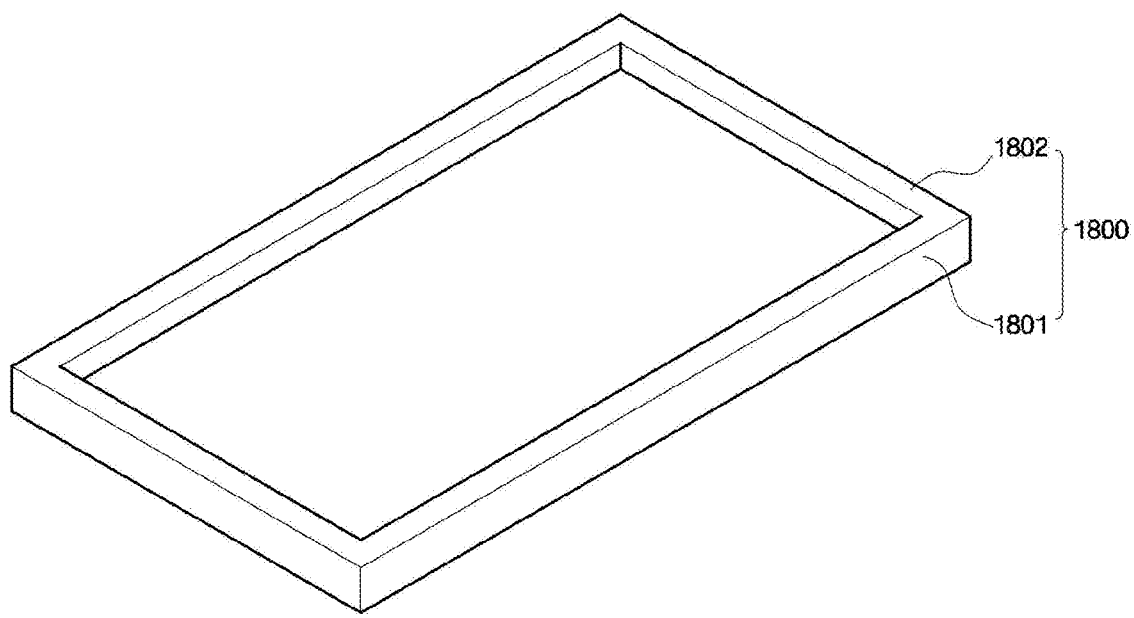
FIG. 5 is a perspective view showing an exemplary embodiment of the support frame of the LCD module of FIG. 4.

FIG. 4 is a cross-sectional view showing another exemplary embodiment of an LCD module according to the present invention and FIG. 5 is a perspective view showing an exemplary embodiment of the support frame of the LCD module of FIG. 4.

Referring to FIG. 4 through 5, a first support frame 1800 includes a plurality of first plates 1801 covering (e.g., overlapping) side surfaces of the mold frame 1500. The first plate 1801 are disposed directly adjacent to an outer face of the sidewalls 1501 of the mold frame 1500, and may overlap an entire of the outer face of the sidewalls 1501. The first plates 1801 may include a bent shape, such as forming a substantial "U" shape, as shown in FIG. 4. Each of the first plates 1801 may include a first portion and a second portion, both disposed substantially vertically and parallel with each other, and connected by a substantially horizontal portion at a lower end of the first plate 1801.

The first support frame 1800 may further include a plurality of second plates 1802 extended substantially horizontally from a first end of the first plates, and overlap edges of the upper surface of the color filter substrate 1102 and the mold frame 1500. The first support frame 1800 including the second plates 1802 is substantially frame shaped, and includes an opened area in a central portion of the second plates 1802 corresponding to a display area of the LCD panel 1100. The support frame 1800 is disposed at a viewing side of the LCD module 1000. A polarizer 1103 attached to the color filter substrate 1102 does not overlap the edges of the color filter substrate 1102, and also does not overlap with any portion of the first support frame 1800 in a plan view. Peripheral edges of color filter substrate 1102 are overlapped by the second plates 1802 of the first support frame 1800, such that an outer side end of the polarizer 1103 and an inner side end of the second plate 1802 are disposed direction adjacent to and facing each other.

The second plates 1802 may include a first portion disposed substantially horizontally and extending from the first end of the first plates 1801, and a second portion disposed substantially vertically and parallel with the first and second portions of the first plates 1801. The second (vertical) portion of the second plates 1802 may be extended from the first (horizontal) portion at a distance from a distal end of the second plate 1802, as shown in FIG. 4. The second portion of the second plates 1802 may be disposed directly adjacent to, contacting and/or overlapping outer side ends of each of the color filter substrate 1102, the TFT substrate 1101 and the panel sheet 1201. The second portion of the second plates 1802 may extend into the receiving space of the mold frame 1500 where the color filter substrate 1102, the TFT substrate 1101 and the panel sheet 1201 are disposed.

The outer end of the polarizer 1103 and the inner side of the second plate 1802 may be separated from each other, in a horizontal direction, by a first distance. A lower surface of the peripheral edges of the color filter substrate 1102 may be separated from a lower surface of the overlapping portion of the second plates 1802 by a second distance taken in a vertical direction. The second plates 1802 and the first plates 1801 of the first support frame 1800 collectively form a single, continuous and indivisible member.

In the illustrated exemplary embodiment, the first support frame 1800 advantageously increases the intensity of the LCD module 1000 and protects upper edges and side surfaces of the LCD module 1000 without increasing the overall thickness of the LCD module. The receiving plates 1502 of the mold frame 1500 are extended from the lower surfaces of the sidewalls 1501. The FPC 1702 including a plurality of chips mounted on the lower surface thereof, and a reflective layer disposed on the upper surface thereof is attached to the lower surfaces of the sidewalls 1501.

Figure 6:
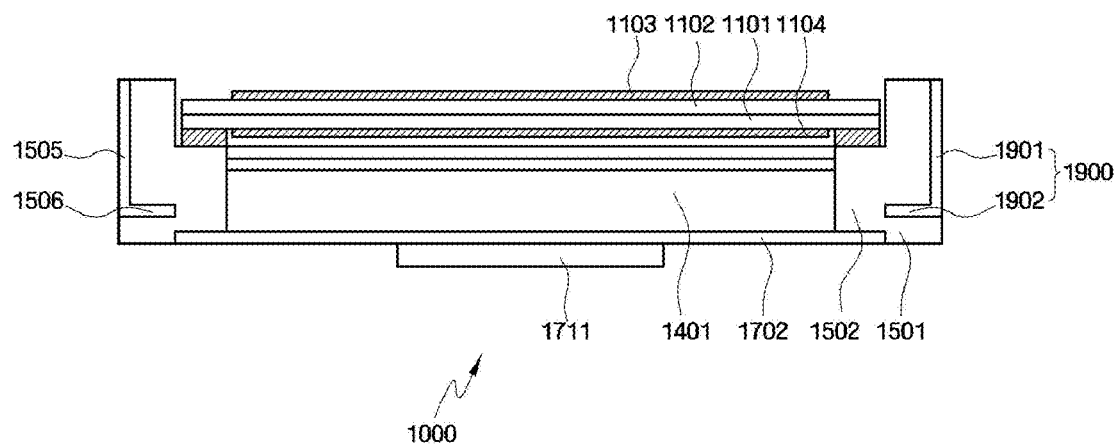
FIG. 6 is a cross-sectional view showing another exemplary embodiment of an LCD module according to the present invention; and, FIG. 7 is a perspective view showing exemplary embodiment of the support frame of the LCD module of FIG. 6.
Figure 7:
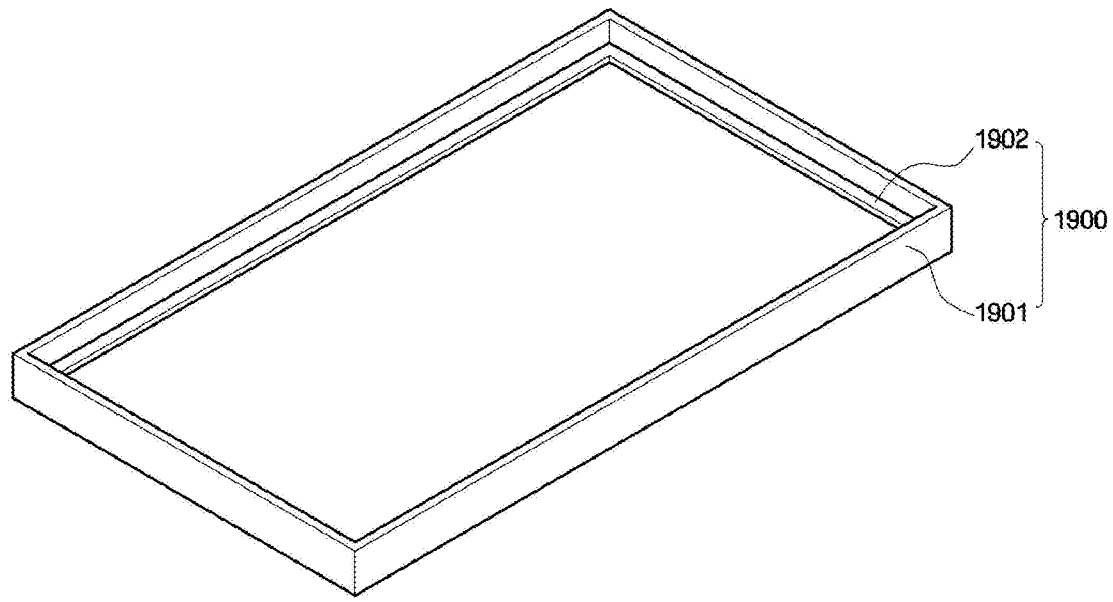

Referring to FIG. 6 through 7, a second support frame 1900 includes a plurality of first plates 1901 extended substantially vertically and disposed in a first receiving member (e.g., grooves) 1505 of the sidewalls 1501 of the mold frame 1500. The second support frame 1900 may further include a plurality of second plates 1902 extended substantially horizontally from a first end of the first plates 1901 and inserted into a second receiving member 1506 (e.g., grooves) of the sidewalls 1501. The second receiving member 1506 extends from an outer face of the sidewall 1501 to an inner area of the sidewall 1501. An outer side face of the second support frame 1900 may be disposed coplanar with a portion of an outer face of the sidewall 1501. An upper face of the second support frame 1900 may be disposed coplanar with an upper face of the sidewall 1501. The first support frame 1800 may be outwardly combined with the second support frame 1900, such as to form a receiving container.

The second plates 1902 and the first plates 1901 of the second support frame 1900 collectively form a single, continuous and indivisible member, as shown in FIGS. 6 and 7.

The outer surface of the second support frame 1900 does not protrude from the outer surface of the mold frame 1500 because the second support frame 1900 is completely disposed in the grooves 1505 and 1506 of the side walls 1501. In the illustrated exemplary embodiment, the second support frame 1900 increases the intensity of the LCD module 1000 without increasing the overall width and thickness of the LCD module 1000.

In an exemplary embodiment, the structure of the illustrated embodiment in FIGS. 6 and 7 may be made by using insert-molding. In the insert-molding process, the second support frame 1900 is prepared before manufacturing the mold frame 1500. The separately prepared support frame 1900 is disposed in a mold for injection molding, and a raw material for the mold frame 1500, such as thermoplastic or thermosetting plastic materials, is injected in the mold. Advantageously, the second support frame 1900 is disposed in the grooves 1505 and 1506 of the sidewalls 1501 of the mold frame 1500 relatively easily by the insert-molding process.

In the illustrated exemplary embodiments, the mold frame 1500, the first (e.g., upper) support frame 1800 and/or the second (e.g., lower) support frame 1900 may be collectively referred to as a receiving container. Since the upper and lower surfaces of the mold frame 1500, the LCD panel 1100 and FPC 1701 are all disposed coplanar with each other, the overall thickness of the LCD module 1000 is advantageously minimized and reduced.

Additionally, since the outer side face and the upper face of the second support frame 1900 are respectively disposed coplanar with the portion of the outer face and the upper face of the sidewall 1501 of the mold frame 1500, an overall dimension (e.g., taken in a longitudinal or transverse direction) of the LCD module 1000 may be further minimized and reduced.

Furthermore, since the second (vertical) portion of the second plate 1802 of the second support frame 1800 is disposed into a receiving space of the mold frame 1500, and adjacent to the color filter substrate 1102, the TFT substrate 1101 and the panel sheet 1201, advantageously an overall dimension, thickness and weight of the LCD module 1000 may be further minimized and reduced.

Having described the exemplary embodiments of the present invention and its advantages, it is noted that various changes, substitutions and alternations can be made herein without departing from the spirit and scope of the invention as defined by appended claims.

What is claimed is:

1. A flat panel display comprising:
   a display panel comprising a display area;
   a mold frame receiving the display panel; and
   a flexible printed circuit comprising:
      a first portion disposed under the mold frame and attached to the mold frame, and overlapping the display area of the display panel; and
      a second portion extended from an end of the first portion and connected to the display panel; and
   wherein the mold frame comprises:
      a sidewall extending in a first direction; and
      a receiving plate extended from the sidewall in substantially a second direction perpendicular to the first direction, the receiving plate of the mold frame disposed between the display panel and the flexible printed circuit.

2. The flat panel display of claim 1;
   wherein a lower surface of the first portion of the flexible printed circuit comprises a plurality of chips driving the display panel.

3. The flat panel display of claim 2;
   wherein the display panel comprises an integrated circuit driving the display panel and disposed on an edge portion of the display panel.

4. The flat panel display of claim 1;
   further comprising a fixing member disposed between the receiving plate and the display panel, the fixing member including an adhesive sheet fixing the receiving plate to the display panel.

5. The flat panel display of claim 1;
   wherein the receiving plate extends from an inner surface of the sidewall and is spaced away from the upper and lower surface of the sidewall in the first direction.

6. The flat panel display of claim 5;
   wherein at least an edge of the upper surface of the first portion of the flexible printed circuit faces a lower surface of the receiving plate, and at least a side surface of the first portion of the flexible printed circuit faces the inner surface of the sidewall.

7. The flat panel display of claim 1;
   wherein the receiving plate extends from a lower surface of the sidewall.

8. The flat panel display of claim 7;
   wherein at least an edge of the upper surface of the first portion of the flexible printed circuit faces a lower surface of the receiving plate and the sidewall.

9. The flat panel display of claim 1;
   further comprising a support frame including a plurality of first plates overlapping outer side surfaces of the mold frame.

10. The flat panel display of claim 9;
    wherein the support frame further comprises a plurality of second plates extended substantially horizontally from the first plates and overlaps an upper surface of the mold frame.

11. The flat panel display of claim 9;
    wherein the support frame further comprises a plurality of second plates extended substantially horizontally from the first plates, and at least one of the second plates inserted into the sidewall of the mold frame in a substantially horizontal direction.

12. The flat panel display of claim 11;
    wherein an outer side surface of the first plates is disposed substantially coplanar with a portion of the outer side surfaces of the mold frame.

13. A liquid crystal display comprising;
    a liquid crystal display panel comprising a display area, a thin-film-transistor substrate, a color-filter substrate, a liquid crystal layer disposed between the thin-film-transistor substrate and the color-filter substrate, a first polarizer disposed on an upper surface of the color-filter substrate, and a second polarizer disposed on a lower surface of the thin-film-transistor substrate;
    a light generating unit including a light source;
    a light guiding unit, guiding the light generated from the light generating unit to the liquid crystal display panel, the light guiding unit comprising a light guide plate disposed between the liquid crystal panel;
    a mold frame receiving the liquid crystal display panel, the light generating unit and the light guiding unit; and
    a flexible printed circuit comprising
       a first portion disposed under the mold frame and attached to the mold frame, and overlapping the display area of the liquid crystal display panel, and
       a second portion extended from one end of the first portion and electrically connected to the liquid crystal display panel,
    wherein a portion of the mold frame disposed between the liquid crystal display panel and the flexible printed circuit.

14. The liquid crystal display of claim 13;
    wherein a lower surface of the first portion of the flexible printed circuit comprises a plurality of chips driving the liquid crystal display panel.

15. The liquid crystal display of claim 13;
wherein the mold frame comprises a sidewall and a receiving plate extended substantially perpendicular from the sidewall, the receiving plate disposed between the liquid crystal display panel and the flexible printed circuit.

16. The liquid crystal display of claim 13;
further comprising a support frame including a plurality of first plates overlapping outer side surfaces of the mold frame.

17. The liquid crystal display of claim 16;
wherein the support frame further comprises a plurality of second plates extended substantially perpendicularly from the first plates, the second plates overlapping an upper surface of the mold frame and edges of the color filter substrate, and facing side ends of the first polarizer.

18. The liquid crystal display of claim 13;
wherein the liquid crystal display further comprises a reflective sheet disposed directly on the first portion of the flexible printed circuit.

19. The liquid crystal display of claim 13;
wherein the flexible printed circuit further comprises a reflective layer disposed on the upper surface of the first portion.

20. A method of manufacturing a display device, the method comprising:
disposing a display panel including a display area, in a mold frame;
attaching a first portion of a flexible printed circuit to a portion of the mold frame, wherein the first portion overlaps the display area of the display panel; and
connecting a second portion of the flexible printed circuit extended from one end of the first portion to the display panel electrically,
wherein the first portion of the flexible printed circuit is exposed to an outside of the display device, and
wherein the portion of the mold frame attached to the flexible printed circuit is not exposed to an outside of the display device.

* * * * *